United States Patent [19]

Cronin

[11] Patent Number: 5,696,030

[45] Date of Patent: Dec. 9, 1997

[54] INTEGRATED CIRCUIT CONTACTS HAVING IMPROVED ELECTROMIGRATION CHARACTERISTICS AND FABRICATION METHODS THEREFOR

[75] Inventor: John Edward Cronin, Milton, Vt.

[73] Assignee: International Business Machines Corporation, Armonk, N.Y.

[21] Appl. No.: 316,689

[22] Filed: Sep. 30, 1994

[51] Int. Cl.⁶ ..................................................... H01L 21/18
[52] U.S. Cl. ..................... 437/208; 437/208; 437/228; 437/915; 257/777; 257/723; 361/744
[58] Field of Search ................................. 257/777, 723; 437/208, 209, 228, 915; 361/744

[56] References Cited

U.S. PATENT DOCUMENTS

| | | | |
|---|---|---|---|
| 4,551,629 | 11/1985 | Carson et al. | 250/578 |
| 4,770,640 | 9/1988 | Walter | 439/69 |
| 4,868,712 | 9/1989 | Woodman | 361/744 |
| 4,875,139 | 10/1989 | Fukui | 361/410 |
| 4,943,539 | 7/1990 | Wilson et al. | 437/195 |
| 4,983,533 | 1/1991 | Go | 437/7 |
| 5,019,943 | 5/1991 | Fassbender et al. | 361/744 |
| 5,110,298 | 5/1992 | Dorinski et al. | 439/65 |
| 5,202,754 | 4/1993 | Bertin et al. | 257/684 |
| 5,235,672 | 8/1993 | Carson | 395/24 |
| 5,247,423 | 9/1993 | Lin et al. | 361/744 |
| 5,266,833 | 11/1993 | Capps | 257/690 |
| 5,270,261 | 12/1993 | Bertin et al. | 437/209 |
| 5,285,571 | 2/1994 | Gorczyca et al. | 29/848 |
| 5,315,147 | 5/1994 | Solomon | 437/203 |
| 5,517,754 | 5/1996 | Beilstein, Jr. et al. | 437/208 |
| 5,571,754 | 11/1996 | Bertin et al. | 437/208 |
| 5,585,674 | 12/1996 | Geffken et al. | 257/767 |

FOREIGN PATENT DOCUMENTS

| | | | |
|---|---|---|---|
| 0 397 462 A2 | 11/1990 | European Pat. Off. | H01L 21/90 |
| 0 571 749 A1 | 12/1993 | European Pat. Off. | H01L 25/10 |
| 1300881 | 12/1972 | United Kingdom . | |

OTHER PUBLICATIONS

"Process for Producing Lateral Chip Connectors", IBM Tech. Disc. Bull., vol. 32, No. 3B, pp. 410–411, Aug. 1, 1989.

Chu et al., "Schottky Barrier Diode Structure and Conductor Metallurgy with Increased Electromigration Resistance", IBM Tech. Disc. Bull., vol. 20, No. 9, pp. 3484–5, Feb. 1, 1978.

IBM Technical Disclosure Bulletin, "Process for Producing Lateral Chip Connectors", vol. 21, No. 3B, (Aug. 1989).

*Primary Examiner*—John Niebling
*Assistant Examiner*—Kevin F. Turner
*Attorney, Agent, or Firm*—Heslin & Rothenberg, P.C.

[57] ABSTRACT

Semiconductor structures and associated methods for limiting electromigration at wiring interfaces. Increased cross-sectional contact sections are employed, with conducting studs in contact therewith. Methods for fabrication and use are disclosed. Contacts for stackable integrated circuit chips and three-dimensional electronic modules particularly are modified with the disclosed structures and methods.

32 Claims, 6 Drawing Sheets

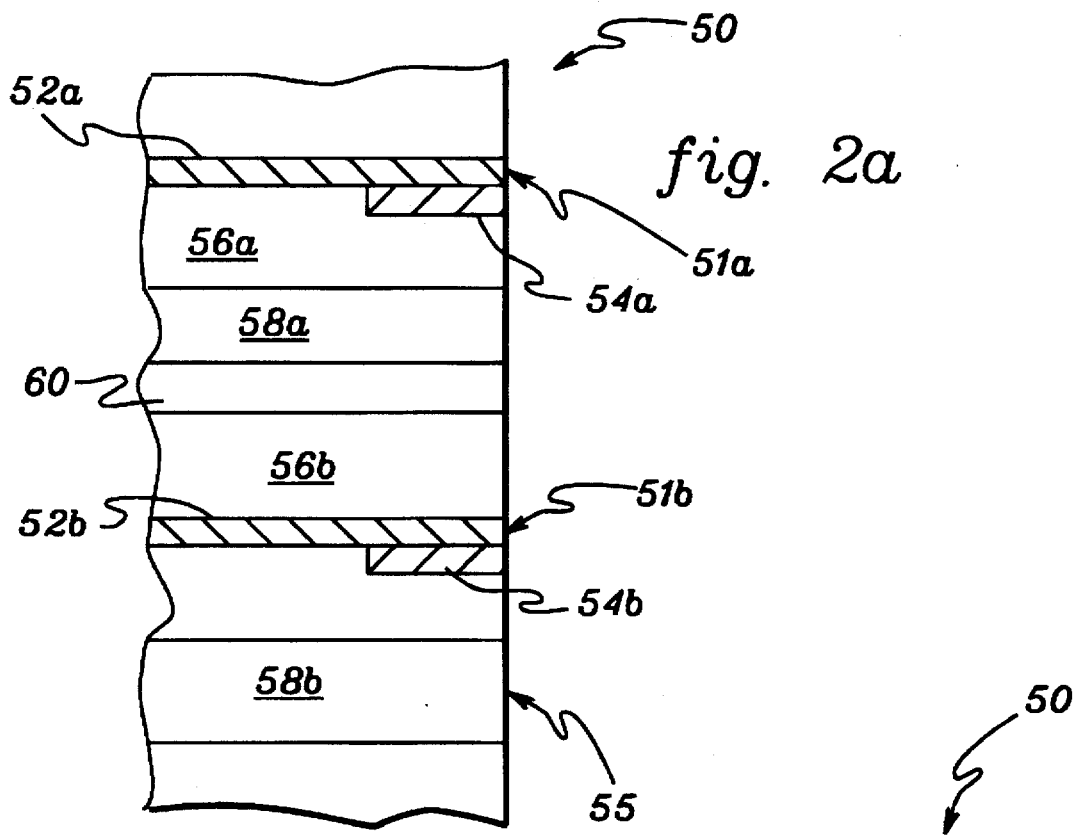
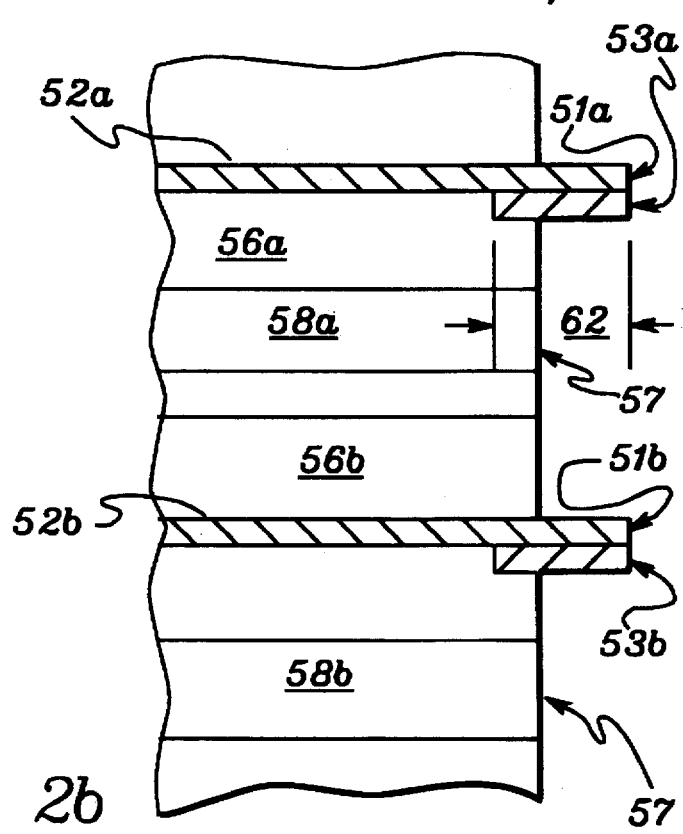

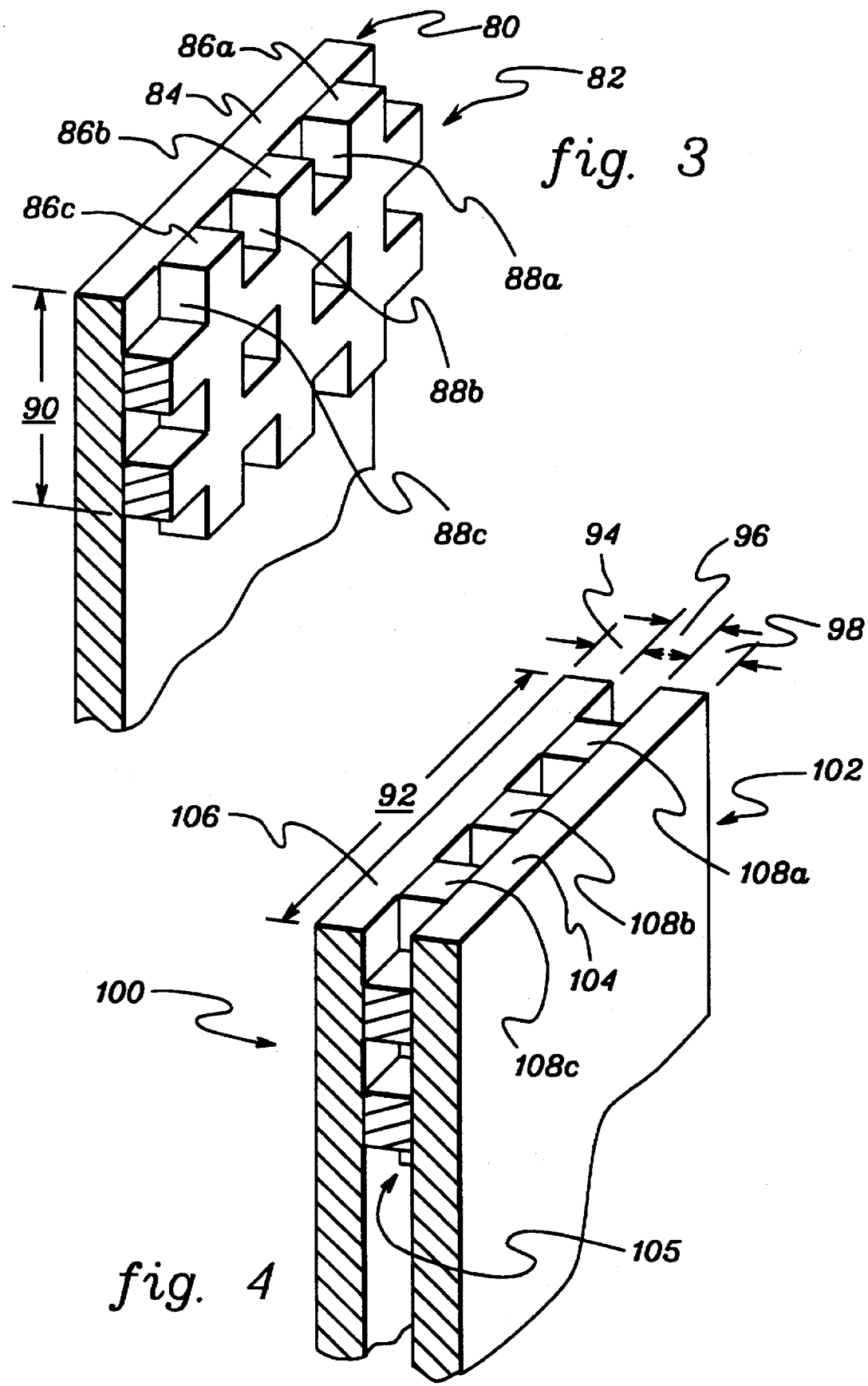

INTEGRATED CIRCUIT CONTACTS HAVING IMPROVED ELECTROMIGRATION CHARACTERISTICS AND FABRICATION METHODS THEREFOR

TECHNICAL FIELD

The present invention relates in general to electronic semiconductor devices and more specifically, the present invention relates to three-dimensional electronic modules and conductive interconnect systems therefor.

BACKGROUND OF THE INVENTION

As is known in the art, electronic devices are fabricated using generally planar integrated circuit chips. Recent advances include stacking multiple such integrated circuit chips into a three-dimensional electronic module, or cube, to increase device density. To electrically connect devices placed on a standard planar integrated circuit chip, leads or electrical conductors can be accessed above the front planar surface of the chip. However, when many such chips are stacked into a three-dimensional module, electrical conductors must be used to route electrical connections from interior chip devices to each chip edge. Access to the devices will depend upon the minimum feature sizes that can be interconnected on the cube face. This results in stringent requirements on the wiring process thereby increasing expense and processing time.

As is known to those skilled in the art, accessing the devices associated with a single, planar integrated circuit chip is straightforward because the electrical access plane can be the same as the area of the planar front surface of the chip. However, if the electrical contacts in a three-dimensional module must be accessed at the edge of each chip, the area available to establish such access or contact is greatly diminished.

As the densities of devices on each stacked chip increase with advances in technology, the access problem along the edges of each chip in a stack worsens. Decreasing the cross-sectional area of each conductor is one way to accommodate the increased device densities on each chip. The cross-sectional area may be measured using, for example, the lateral pitch of each conductor multiplied by its thickness. Present designs include, for example, conductor pitches of 100 µm with thicknesses of 1-2 µm. Future designs could employ pitches of less than 100 µm.

One standard technique for accessing the electrical conductors at the cube face is that of a simple T-Connect formed between exposed ends of the electrical conductors and an imposed wiring network on the face of the module. The T-Connect may comprise an electrical contact pad which is placed perpendicular to, and in electrical contact with, the conductor along its exposed end surface. However, as the pitch of the electrical conductor is decreased, electromigration becomes a problem at the wiring interface. As the contact area decreases, current densities increase, and the electromigration design points become problematic.

Electromigration can lead to conductor failure because of the mass transport which occurs under the larger electric field associated with smaller cross-sectional areas. Electromigration can be of particular concern near interfaces at which current divergence or thermal divergence occurs, e.g., a discontinuous conductor contact, or a change in current direction. Both conditions exist at the contacts employed for three-dimensional module wiring including the T-connect, as discussed above. The pitch of the electrical conductors therefore cannot be arbitrarily decreased and yet be expected to accommodate the same current density.

A solution to this problem is therefore required which provides the required current density and electrical characteristics of present wiring interfaces but which can be employed in the environment of small wiring pitches associated with large device densities in stacked, integrated circuit chips.

SUMMARY OF THE INVENTION

The present invention provides in one aspect, a stackable integrated circuit chip having a substantially planar chip body with a perimeter edge, and at least a first elongate conductor for interconnection of chip circuit components. The conductor has a predetermined nominal cross-sectional area and runs in a plane substantially parallel to the plane of the chip body. The conductor terminates in a contact section which protrudes beyond the perimeter edge of the integrated circuit chip. The contact section has a cross-sectional area greater than the nominal cross-sectional area of the conductor. The contact section may include a conducting stud and a contact surface. The conducting stud and the conductor generally are formed in respective metallization levels during the wafer processing associated with the chip. The stud and the conductor generally can be formed from differing materials, and the stud material can be formed of the material having a greater resistance to electromigration than that of the conductor. The stud can be formed as part of a planar stud via level and can have a waffled shape, thus providing additional contact surface area.

In another aspect of the invention, a three-dimensional electronic module is provided which comprises multiple, stacked integrated circuit chips, at least some of said chips being stackable integrated circuit chips as set forth above.

In another aspect of the invention, a method is provided for forming a stackable integrated circuit chip. The method includes providing a substantially planar chip body having an intended perimeter edge, and forming a first elongate conductor therein for interconnection of chip circuit components. The conductor is formed in a plane substantially parallel to the plane of the chip body, and has a predetermined nominal cross-sectional area. The conductor has a contact section protruding beyond the intended edge of the chip wherein the contact section has a greater cross-sectional area than the nominal cross-sectional area of the conductor. The contact section of the conductor can be formed using a conducting stud. The conducting stud and the conductor generally are formed in respective metallization levels and the conducting stud is formed near the intended perimeter edge during the formation of its respective metallization level. The conducting stud is formed having either uniform depth or non-uniform depth, and can be formed in a waffled shape.

In another aspect of the invention, a method for forming a three-dimensional electronic module is provided which includes combining a plurality of integrated circuit chips into a three-dimensional electronic module, the chips being formed as discussed above. The method includes laminating a plurality of chips together to form a stack and processing the stack face such that the end of the contact section is exposed. The method further includes forming a conductor on the face of the three-dimensional module and in contact with the contact section.

In another aspect of the invention, a method for limiting electromigration at a module face contact is provided, wherein the module contact includes an exposed end surface of a first elongate conductor of a nominal cross-section running in the module. The method includes the step of enlarging a contact section of the first elongate conductor at and immediately beneath the module face, such that the exposed end surface has a greater area than the nominal cross-sectional area of the elongate conductor. The step of enlarging the contact section can be accomplished by using a conducting stud. The conducting stud can be waffled such that a non-planar end surface is created for electrical contact. The conducting stud can be formed from a material having a greater resistance to electromigration than the material forming the elongate conductor generally. The conductor generally can be formed from aluminum and the stud can be formed from tungsten.

In yet another aspect of the invention, a stackable integrated circuit chip is provided which comprises a substantially planar body with a perimeter edge, and further comprises first and second elongate conductors for interconnection of chip circuit components wherein each conductor has a contact section protruding beyond the edge of the integrated circuit chip, and wherein the contact sections are in contact with each other. The chip can be formed with the conductors in different metallization levels in the chip, and possibly a conducting stud formed in contact with the contact sections, for instance, between the two contact sections of the two elongate conductors.

The methods and structures disclosed provide a solution to electromigration problems of module contacts and increase contact area to minimize contact resistance. By employing the methods and structures disclosed herein, the required current density and electrical characteristics of present wiring interfaces can be employed in an environment of small wiring pitches in integrated circuit chips and electronic modules.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following detailed description of the invention and the accompanying drawings in which:

FIGS. 2a–d are sequential sectional views of two integrated circuit chips in a three-dimensional electronic module pursuant to the present invention illustrating module face processing techniques used to expose the contact surfaces of the contact sections;

FIG. 3 is an isometric, sectional view of the contact section of an elongated conductor having a waffled conducting stud attached thereto pursuant to the principles of the present invention;

FIG. 4 is an isometric sectional view of the ends of two elongated conductors having a conducting stud positioned therebetween pursuant to the principles of the present invention;

DESCRIPTION OF THE INVENTION

Figure 1:
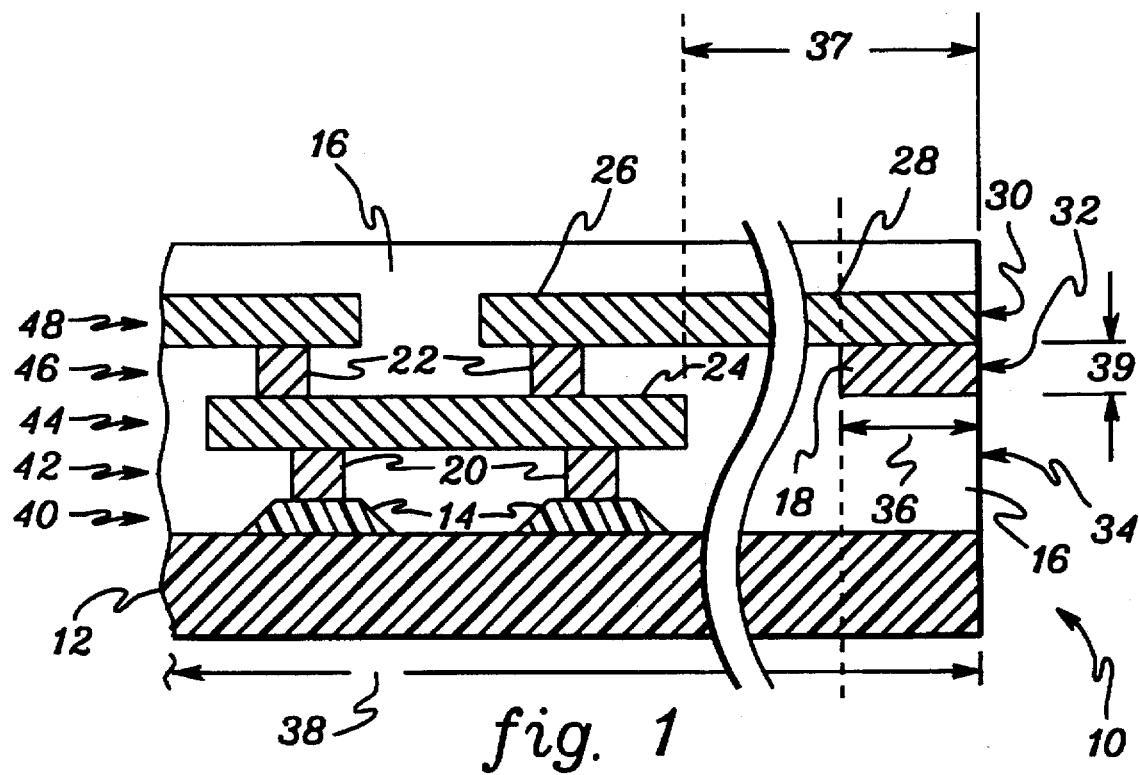
FIG. 1 is a sectional view of a stackable integrated circuit chip having an elongate conductor with an enlarged contact section pursuant to the principles of the present invention.

As those skilled in the art know, large numbers of integrated circuit chips are initially formed on a single wafer. At a certain point in the chip fabrication process, individual chips are diced out of the wafer for further individual chip processing. FIG. 1 shows an individual stackable chip 10 according to the present invention as it would appear immediately following the dicing step. One diced end of chip 10 is shown in FIG. 1 as dicing plane 34. Chip 10 is intended to be used in a stack with other such chips thereby forming an electronic module having electrical contact surfaces on at least one of its faces for interconnection within a computer system.

With reference to FIG. 1, a chip normally comprises a substrate 12 having devices 14 formed thereon. For the purposes of this disclosure, the terms "devices" and "components" are used interchangeably and generally refer to any functional unit within the integrated circuit chip whether passive or active. As shown in FIG. 1, the devices are located in one or more dedicated levels, and one level 40 is shown. To interconnect the devices, metallization levels 42, 44, 46 and 48 are provided. For instance, a stud via level 42 including studs 20 is formed to connect, in a vertical direction, two horizontal levels, i.e., levels 40 and 44. A wiring level 44 having conductors such as conductor 24 is provided to provide horizontal interconnectivity between studs and/or devices. Another metallization level 46 can be a stud via level, again having studs 22 to provide another vertical interconnection between levels 44 and 48.

Finally, metallization level 48 is provided which again provides horizontal connectivity but also includes conductor 26, an elongate conductor, which extends to the dicing plane 34 of the chip and terminates in an end 30. (Insulating material 16 is shown as a continuous region, but the material employed in each level may be different.) The possible length of an elongated conductor is illustrated by dimension 38 which merely represents the potential length of a conductor from inside the chip to the dicing plane 34. One process followed in forming a module involves etching dicing plane 34 back to an intended chip edge shown by dashed line 28, as will be more fully described below with reference to FIGS. 2a–d.

Pursuant to an embodiment of the present invention, before the final metallization level 48 is formed, a stud 18 is formed during the formation of stud via level 46, and is formed to be in electrical contact with elongate conductor 26 in the general area between the intended chip edge and dicing plane 34. In effect, conductor 26 is thus enlarged in cross-section due to the presence of stud 18. This enlarged section of conductor 26 is referred to herein as the "contact section" of the conductor. The diced end 32 of the stud 18 combines with end 30 to produce an enlarged contact surface 30,32 for a possible T-Connection. The thickness 39 of the stud, in the embodiment shown, coincides with the thickness of level 46. However, because of the potential length 38 of the elongated conductor, there is generally ample distance 37 between the lower levels and the diced end to allow the lateral length 36 of the stud or thickness 39, to be varied. In one embodiment, the length 37 is more than 100 μm and the length 36 of the stud 18 is 5–10 μm. The stud, in this example, is formed from the same material used to form all of the studs in level 46.

Figure 2C:
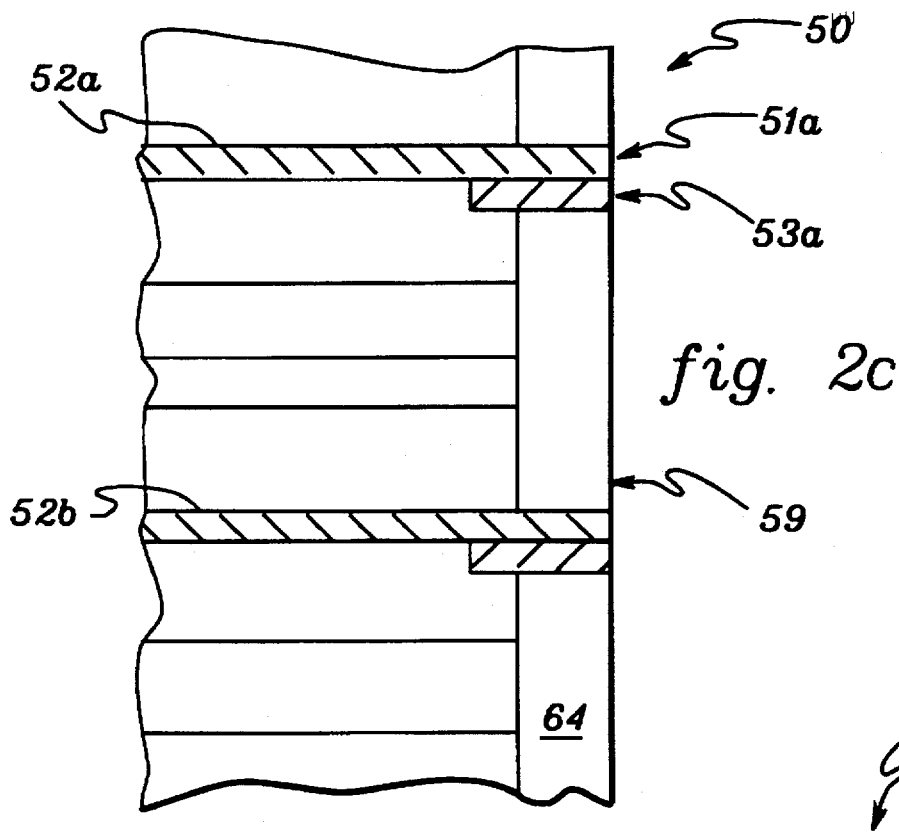

FIGS. 2a–d illustrate the steps followed in creating a module by stacking chips of the type shown in FIG. 1. The purpose of these processing steps is, of course, to produce a module having enlarged contact surfaces on a face thereof for interconnection with a computer system. FIG. 2a shows two stackable integrated circuit chips in stack 50 (near the dicing plane 55), the first comprising substrate 58a, insulating material 56a, and elongate conductor 52a having end 51a. The second chip is shown laminated to the first and it comprises substrate 58b, insulator 56b and conductor 52b having end 51b.

Figure 2D:
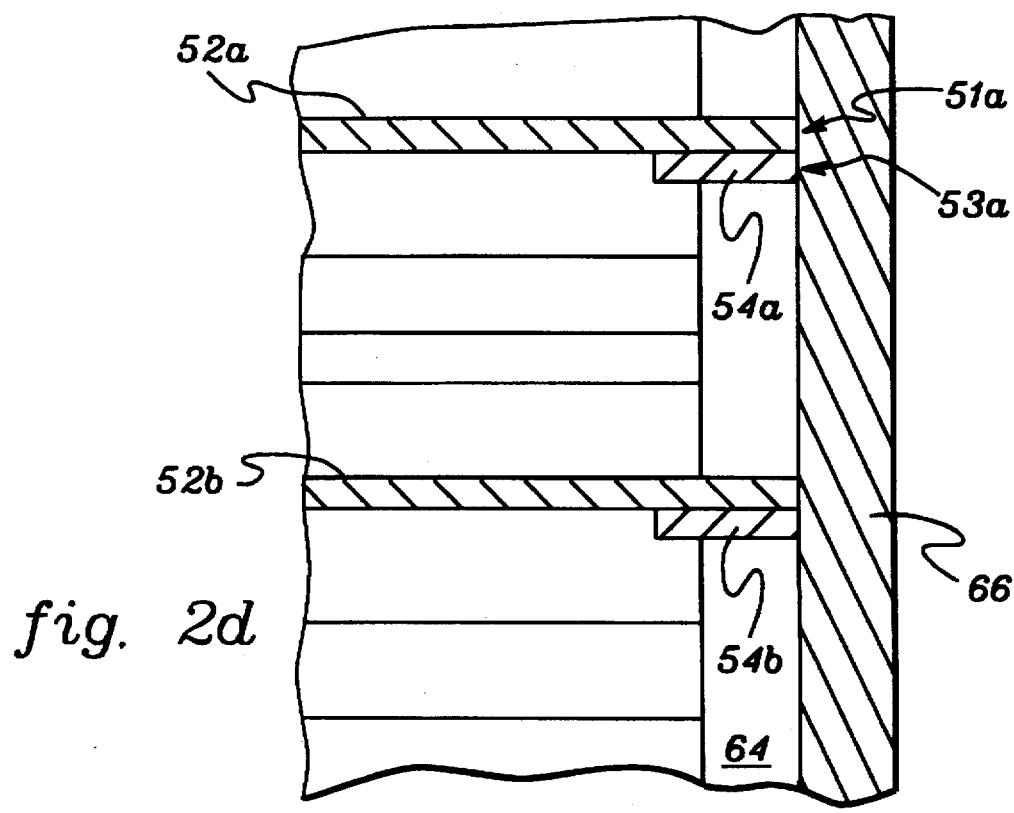

Pursuant to the principles of the present invention, conducting studs 54a and 54b, having ends 53a and 53b, have been added to form the contact sections of conductors 52a and 52b, respectively. The contact sections are formed near the edges 57 of each stacked chip as shown in FIG. 2b. Thus, as shown in FIG. 2d, following module face processing (more fully described below), a combined contact surface 51a,53a is utilized in conjunction with a module face conductor 66 for an electrical interface. The electromigration near this interface is greatly reduced by the presence of conducting stud 54a within the contact section of elongate conductor 52a.

With reference to FIG. 3, a preferred embodiment of the contact section is illustrated in an isometric view. The isometric view of FIG. 3 (and FIGS. 4, 5) depicts only the metallized contact section, e.g., the area generally indicated by dimensions 36 and 37 in FIG. 1. Again, the wafer processing and level forming steps are modified such that a conducting stud 82 is placed in contact with the conductor 80 near the dicing plane of the stackable integrated circuit chip. Pursuant to the present invention, stud 82 is waffled, as shown. As used herein, the term "waffled" means any shape in which the conducting material forming the stud is not uniformly distributed throughout the volume which the stud occupies. The waffled nature of the stud provides benefits both during fabrication and during its use. The fabrication advantage involves an improvement in the filling and planarization steps (more fully discussed below).

The advantage of the waffled stud in use involves the additional electrical contact surfaces of the stud. In the particular embodiment shown in FIG. 3, the contact surface near the edge of the cube would include surfaces 86a–c and surface 84. However, surfaces 88a–c are now also available for electrical contact with the module face conductor if proper polishing and etching are used to create and expose these surfaces. A deposited module face conductor will "fill" the etched voids and therefore contact the vertical surfaces 88a–c.

Those skilled in the art will understand that the isometric view shown only depicts the metallized portions of the conductor levels and that insulating materials would actually be contained within the voids in the waffle structure. However, this insulator may be etched away during module face processing resulting in surfaces 88a–c, which surfaces can then be used during the module face wiring as additional electrical contact surfaces. Again, the size of the stud illustrated here by dimension 90 is variable and, in one example, is 5–10 μm. However, as discussed above, 100 μm or more may be available between the dicing plane of the chip and the outer perimeter of the lower device levels in which the stud may be formed.

FIG. 4 illustrates yet another embodiment of the present invention in which a waffled stud 105 is formed between conductors 100 and 102. In this case, the overall contact surface for each of the conductors near the edge of the module is now increased from individual thicknesses of width 92 multiplied by thickness 94, and width 92 multiplied by thickness 98, to width 92 multiplied by the combined thicknesses of the conductors, i.e., 94 and 98, plus the stud dimension 96. Again, surfaces 108a–c of the stud are now additionally available for contact with the module face contacts, as are surfaces 106 and 104 of the conductors, and the vertical stud surfaces below surfaces 108.

Figure 5:
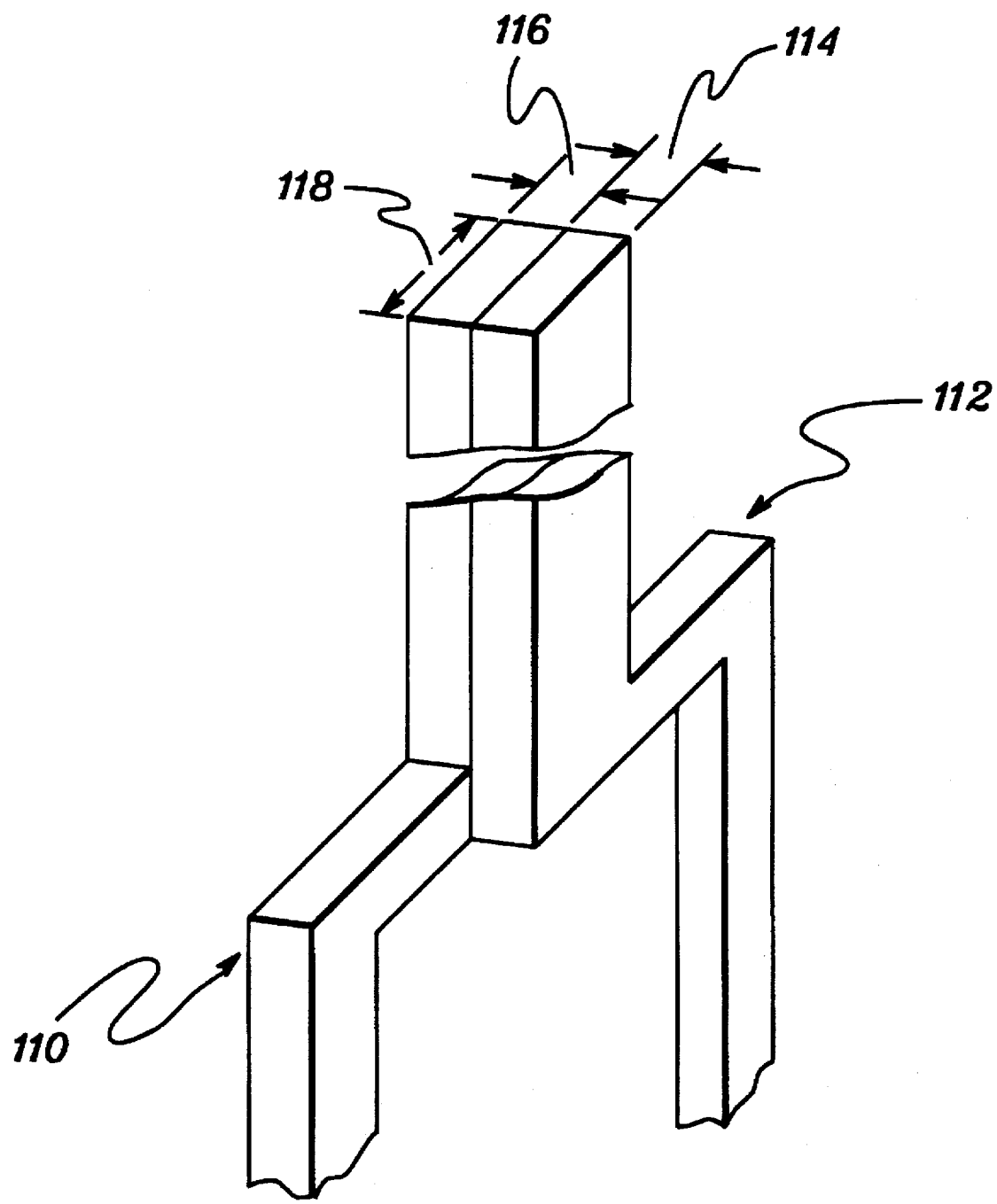
FIG. 5 illustrates an embodiment of the present invention in which two elongated conductors are brought together to form a combined contact surface pursuant to the principles of the present invention.

FIG. 5 illustrates yet another embodiment of the present invention in which conductors 110 and 112 are combined near the perimeter edge of a chip to form a contact surface defined by the dimensions 114, 116 and 118. In this embodiment, a conducting stud is not employed. However, there still is some improvement in electromigration characteristics near the edge because of the combined thicknesses of the conductors. Those skilled in the art will recognize that the combination of conductors near the edge of a chip can be fabricated in many ways. The conductors can be deposited in two different levels as shown, or separate conductors can be deposited in the same level.

A preferred method of the subject invention will now be described. With reference to FIG. 1, a substrate 12 is provided on which devices 14 can be placed. Lower metallization levels such as stud via level 42 and wiring level 44 are then formed using standard photolithographic mask and etch steps. For instance, for the formation of level 42, a planarized insulator can be deposited over level 40 on which a mask (not shown) is applied. The openings for studs 20 are exposed and developed in the mask and are used to etch the insulator. One etch process includes employing $CF_4$ in a reactive ion etching mode. Those skilled in the art will recognize that many deposition and etch techniques are possible. Studs 20 are then formed by deposition of, for instance, tungsten in the etched openings and the now combined insulator and tungsten layer is planarized resulting in level 42. The tungsten may be deposited using chemical vapor deposition (CVD).

Level 44 is formed, for instance, by depositing over level 42 a layer of aluminum, and by using mask and etch techniques, removing areas of aluminum except for conductive stripe 24. The removed areas are then filled with insulator and planarized resulting in a planar level 44. Level 46 can then be formed with stud 18 near the intended chip edge pursuant to the principles of the present invention. An embodiment of the etch pattern used to form a stud is illustrated in FIG. 6.

Figure 6:
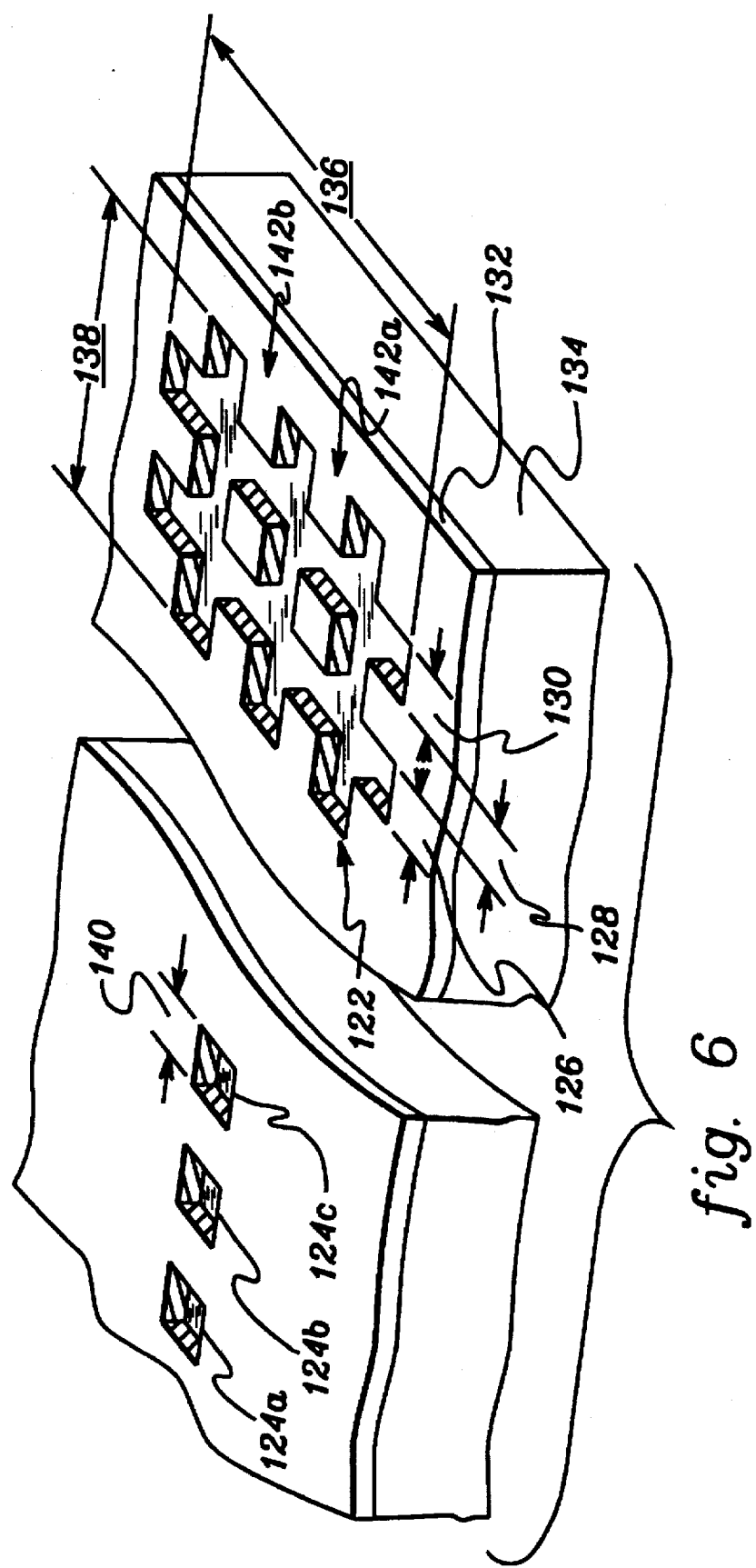
FIG. 6 illustrates, in an isometric view, an embodiment of the etch patterns employed to form a conducting stud pursuant to the principles of the present invention.

In FIG. 6, layer 134 generally represents the lower layers upon which a stud via level 132 will be formed. Again, an insulator is deposited and a photoresist mask (not shown) can be applied over the insulator. In this case, the photoresist mask is exposed in both interior regions for the conducting stud vias such as regions 124a–c as well as for the formation of the conducting stud such as region 122. FIG. 6 illustrates level 132 following the etch according to the photoresist mask. Here, regions 124a–c are created for interior studs, and region 122 is created for the conducting stud in the area between the intended dicing plane and the intended chip edge (not shown). The dimensions of the interior studs, for instance 140, may in general be much smaller than the lateral dimensions of the stud, either lateral dimension 136 or 138.

While the region 122 could have been formed as one continuous cavity, the preferred embodiment requires a waffled region such that the openings to be filled with CVD-tungsten are generally of dimensions 126, 128 and 130. These dimensions may generally correspond to the dimension 140. During the CVD process, region 122 will therefore be filled at the same rate as regions 124a–c since filling occurs from the top, bottom, and sides equally. This results in a simplification of the deposition and planarizing process, as well the added benefit of the increased contact surfaces after module face processing. For instance, the regions 142a and 142b, following formation of the chip and wafer dicing, can be used to increase the electrical contact area available for deposited conductors at the module face. This is accomplished, as discussed above in relation to FIG. 3, by etching the insulator in regions 142a and 142b thereby exposing the (vertical) stud surfaces for electrical contact.

The size of the stud including the lateral dimensions 136 and 138 and its thickness or depth can be varied to provide proper electromigration characteristics without varying from the intended scope of the present invention. In one example, lateral dimension 138 of the stud may be 5 μm while the pitch or lateral dimension 136 of the stud may be 1 μm or less. When referring to the lateral dimension 138, the terms "at and immediately beneath the edge," of a module can be used regardless of the precise dimensional value.

If required to accommodate high densities of chip devices and wiring, lateral dimension 136 or pitch can be reduced. However, the amount of available area represented in the lower levels, for instance level 134 which represents the possible depth of the stud, as well as the amount of area available between the edge of the chip and interior devices, represented by dimension 37 in FIG. 1, allows expansion of the module face contact without sacrificing the chip device density. That is, expansion of the contact either down into level 134 or inward along dimension 138 is provided pursuant to the present invention to compensate for smaller wiring pitches.

Following the creation of the cavities as shown in FIG. 6, the stud substance such as tungsten is deposited and planarized back to be coplanar in level 132 to form the stud via level 46 as shown in FIG. 1 with the stud formed waffled as in FIG. 3. Following the formation of the stud via level, again, an aluminum film can be deposited and the aluminum film is masked to form elongate conductor 26 as shown in FIG. 1. The aluminum is etched to leave the elongate conductor and then a final insulator layer is formed over the entire chip.

An alternate though not preferred embodiment involves forming an enlarged contact section during the formation of the elongate conductor. Also, in some technologies, studs are created by a subtractive process, i.e., metal films are deposited and etched away in regions so that in some regions, studs are exposed "proud" of the surface. This is followed by insulator deposition and planarization.

The steps up to now have, in one embodiment, generally been at the wafer level. Following the wafer level processing steps, each wafer is diced into individual chips. The chips are laminated together to form a module such as that shown in FIG. 2a and module face processing continues to expose the contact surfaces of the conductors. For further information regarding module face processing techniques, refer to U.S. Pat. No. 4,525,921 entitled "HIGH-DENSITY ELECTRONIC PROCESSING PACKAGE—STRUCTURE AND FABRICATION."

Upon stacking and laminating the chips as shown in FIG. 2a, a stack face 55 is formed from the respective dicing planes of the individual chips. Lamination is accomplished, for instance, with a thermid layer 60 which upon a heat cycle cures to insure a bonding between the two chips. The stack face 55 can be etched utilizing a selective etching process to which the metallized conductors are immune. Such an etching process may result in the edges 57 of each stacked semiconductor chip as shown in FIG. 2b. The etched distance is not controlled by the length 62 of the stud and can be less than (as shown) or more than the stud length. The terms "protruding beyond," when used in conjunction with the contact section, merely indicate that all or a part of the contact section is positioned outside of the chip edge.

Following the face etch process, the edges of the semiconductor chips are covered with a blanket insulator or polyimide 64 as shown in FIG. 2c. The module face and conductor ends are then polished using, for example, chemical-mechanical polishing to leave the contact surfaces exposed, as shown in FIG. 2c. This process results in module face 59 having coplanar conductor ends 51a and 53a, which together comprise a combined contact surface for elongated conductor 52a.

Finally, as shown in FIG. 2d, the module face conductive wiring 66 is deposited such that the T-Connections are formed with the elongate conductors, e.g., at contact surface 51a,53a.

In one embodiment, the stud is formed from tungsten while the conductor generally is formed from aluminum. The tungsten stud will have a greater resistance to electromigration than would the aluminum wiring generally. The effect of adding the conducting stud improves the overall contact resistance of the contact section, improves the contact area, and since the contact resistance is statistically proportional to the electromigration resistance, the electromigration is thereby reduced. Thus, level-to-level or stud technology can be used for enhancing cube face wiring electromigration resistance, and for decreasing contact resistance.

Those skilled in the art will recognize that chip and module forming techniques other than those described herein are available and that the inventive concepts disclosed would apply equally therein.

While the invention has been described in detail herein in accordance with certain preferred embodiments thereof, many modifications and changes therein may be affected by those skilled in the art. Accordingly, it is intended by the following claims to cover all such modifications and changes as fall within the true spirit and scope of the invention.

I claim:

1. A method for forming a stackable integrated circuit chip, said method comprising the steps of:

providing a substantially planar chip body for holding circuit components, said chip having an intended perimeter edge; and forming a first elongate conductor in said chip body for interconnection of chip circuit components, said conductor being formed in a plane substantially parallel to the plane of said chip body and having a nominal cross-sectional area, said conductor having a contact section protruding beyond the intended edge of said integrated circuit chip, said contact section having a cross-sectional area greater than the nominal cross-sectional area of the conductor.

2. The method of claim 1 wherein the conductor forming step includes the step of forming a conducting stud as part of the contact section.

3. The method of claim 2 wherein the step of forming the conducting stud includes the step of forming a first metallization level in said chip body according to a first mask, wherein said first mask allows the conducting stud to be formed near said intended perimeter edge and in said contact section of said elongate conductor.

4. The method of claim 3 wherein the step of forming the first elongate conductor includes the step of forming a second metallization level in said chip body according to a second mask, said first elongate conductor being generally positioned within said second metallization level.

5. The method of claim 3 wherein the step of forming the first metallization level includes the steps of:

depositing a generally planar layer;

etching said planar layer according to said first mask thereby creating etched regions in said layer; and depositing a conducting material in said etched regions, said conducting material and said layer forming said first metallization level.

6. The method of claim 5 wherein the step of etching includes the step of etching a region near the intended perimeter edge for said conducting stud, said region being of a uniform depth.

7. The method of claim 5 wherein the step of etching includes the step of etching a region near the intended perimeter edge for said conducting stud, said region being of a non-uniform depth.

8. The method of claim 7 wherein the region near the intended perimeter edge is etched such that the resulting conducting stud is waffled.

9. A method for forming a three-dimensional electronic module comprising the step of combining a plurality of integrated circuit chips into said three-dimensional electronic module, at least one of said chips being formed according to claims 1 or 2.

10. The method of claim 9 wherein the step of combining includes:

laminating the plurality of chips together to form a stack; and processing a stack face such that the end of said contact section is exposed.

11. The method of claim 10 wherein the step of processing includes:

etching the stack face to the intended edges of said integrated circuit chips thereby exposing said contact section;

covering the stack face with an insulator; and polishing the stack face such that a three-dimensional module is formed having a module face and an exposed end of said contact section.

12. The method of claim 9 further comprising forming a conductor on a face of the three-dimensional module and in contact with said contact section.

13. The method of claim 2 wherein the conductor forming step includes the step of forming the first elongate conductor generally in a metallization level in said chip body, and further comprising the step of forming a second elongate conductor in a metallization level in said chip body different than that of the first elongate conductor generally, such that a portion of the second elongate conductor protrudes beyond the intended edge of said integrated circuit chip and at least partially forms said contact section of the first elongate conductor.

14. A method for limiting electromigration at a stackable integrated circuit chip contact, said contact to comprise an end surface of a first elongate conductor of nominal cross section running in said chip, said end surface to be exposed at an intended edge of the chip, said method comprising the step of enlarging a section of the first elongate conductor at and immediately beneath the intended edge of the chip such that the end surface to be exposed at the intended edge of the chip has an area greater than the nominal cross-sectional area of the first elongate conductor.

15. The method of claim 14 wherein the step of enlarging includes the step of using a conducting stud.

16. The method of claim 15 wherein the conducting stud is waffled.

17. The method of claim 15 wherein the enlarged end surface is non-planar such that the surface area available for electrical contact therewith is increased.

18. The method of claim 15 wherein the conducting stud is formed from a material having a greater resistance to electromigration than the material forming the elongated conductor generally.

19. The method of claim 18 wherein the conductor generally is formed from aluminum and the stud is formed of tungsten.

20. The method of claim 15 wherein the elongate conductor and the conducting stud are each formed in a corresponding metallization level of said integrated circuit chip.

21. The method of claim 15 wherein the step of enlarging includes the step of using a second elongate conductor, said second elongate conductor running in said integrated circuit chip and having a portion at least partially forming said enlarged section of said first elongate conductor.

22. The method of claim 14 further comprising the steps of stacking the chip in a semiconductor module comprising a plurality of chips, and applying a conductor on a face of said module and in contact with said enlarged section of said first elongate conductor.

23. The method of claim 14 wherein the step of enlarging includes joining a portion of a second elongate conductor running in the chip to the section of the first elongate conductor at and immediately beneath the intended edge of the chip.

24. The method of claim 23 wherein the second elongate conductor is formed in a different metallization level than that of the first elongate conductor.

25. The method of claim 1 wherein the conductor forming step includes the step of forming the first elongate conductor generally in a metallization level in said chip body, and further comprising the step of forming a second elongate conductor in a metallization level in said chip body different than that of the first elongate conductor generally, such that a portion of the second elongate conductor protrudes beyond the intended edge of said integrated circuit chip and at least partially forms said contact section of the first elongate conductor.

26. A method for limiting electromigration at an edge contact section of a stackable electronic unit conductor running from within the body of the unit toward the intended edge of the unit and terminating in said edge contact section near the intended edge of the unit, comprising:

forming the edge contact section near the intended edge of the unit using metallization from two separately formed metallization levels employed for electrical connectivity within the body of the unit.

27. The method of claim 26, further comprising:

dicing the unit, at or near its intended edge, from a wafer after said forming the edge contact section.

28. The method of claim 27, further comprising:

stacking the unit in a three-dimensional electronic module after said dicing.

29. The method of claim 28, further comprising:

applying metallization on a side face of said three-dimensional electronic module and in contact with the edge contact section.

30. The method of claim 29, wherein the electronic unit comprises an integrated circuit chip and wherein at least one of said two separately formed metallization levels comprises a stud via level formed in said integrated circuit chip.

31. The method of claim 26, further comprising:

stacking the unit in a three-dimensional electronic module.

32. The method of claim 31, further comprising:

applying metallization on a side face of said three-dimensional electronic module and in contact with the edge contact section.

* * * * *